United States Patent
Tanaka et al.

(10) Patent No.: US 9,955,574 B2
(45) Date of Patent: Apr. 24, 2018

(54) COPPER FOIL COMPOSITE, FORMED PRODUCT AND METHOD OF PRODUCING THE SAME

(75) Inventors: Koichiro Tanaka, Ibaraki (JP); Kazuki Kammuri, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 921 days.

(21) Appl. No.: 14/369,909

(22) PCT Filed: Jan. 13, 2012

(86) PCT No.: PCT/JP2012/050591
§ 371 (c)(1),
(2), (4) Date: Oct. 6, 2014

(87) PCT Pub. No.: WO2013/105266
PCT Pub. Date: Jul. 18, 2013

(65) Prior Publication Data
US 2015/0064493 A1    Mar. 5, 2015

(51) Int. Cl.
*B32B 15/00* (2006.01)
*H05K 1/03* (2006.01)
(Continued)

(52) U.S. Cl.
CPC ............. *H05K 1/0393* (2013.01); *B32B 7/02* (2013.01); *B32B 15/08* (2013.01); *B32B 15/20* (2013.01);
(Continued)

(58) Field of Classification Search
None
See application file for complete search history.

(56) References Cited

U.S. PATENT DOCUMENTS

| 4,250,375 A | 2/1981 | Tsutsumi et al. |
| 4,522,880 A | 6/1985 | Klostermeier et al. |

(Continued)

FOREIGN PATENT DOCUMENTS

| EP | 0691389 | 1/1996 |
| EP | 2 100 987 | 9/2009 |

(Continued)

OTHER PUBLICATIONS

Advisory Action corresponding to U.S. Appl. No. 13/382,360 dated Mar. 6, 2017.
(Continued)

*Primary Examiner* — Daniel J Schleis
(74) *Attorney, Agent, or Firm* — Jenkins, Wilson, Taylor & Hunt, P.A.

(57) ABSTRACT

A copper foil composite comprising a copper foil and a resin layer laminated thereon, satisfying an equation 1: $(f_3 \times t_3)/(f_2 \times t_2) => 1$ wherein $t_2$ (mm) is a thickness of the copper foil, $f_2$ (MPa) is a stress of the copper foil under tensile strain of 4%, $t_3$ (mm) is a thickness of the resin layer, $f_3$ (MPa) is a stress of the resin layer under tensile strain of 4%, and an equation 2: $1 <= 33 f_1/(F \times T)$ wherein $f_1$ (N/mm) is 180° peeling strength between the copper foil and the resin layer, F(MPa) is strength of the copper foil composite under tensile strain of 30%, and T (mm) is a thickness of the copper foil composite, wherein a Cr oxide layer is formed at an coating amount of 5 to 100 μg/dm². is formed on a surface of the copper foil on which the resin layer is not laminated.

20 Claims, 1 Drawing Sheet

(51) Int. Cl.
*B32B 15/08* (2006.01)
*H05K 1/09* (2006.01)
*H05K 3/02* (2006.01)
*B32B 7/02* (2006.01)
*B32B 15/20* (2006.01)
*H05K 1/05* (2006.01)

(52) U.S. Cl.
CPC ............ *H05K 1/053* (2013.01); *H05K 1/056* (2013.01); *H05K 1/09* (2013.01); *H05K 3/022* (2013.01); *B32B 2307/712* (2013.01); *B32B 2457/08* (2013.01); *H05K 2201/0145* (2013.01); *H05K 2201/0154* (2013.01); *H05K 2201/0355* (2013.01); *H05K 2201/0358* (2013.01); *H05K 2201/05* (2013.01); *H05K 2201/06* (2013.01); *Y10T 29/302* (2015.01); *Y10T 428/12438* (2015.01); *Y10T 428/273* (2015.01)

(56) References Cited

U.S. PATENT DOCUMENTS

| | | | |
|---|---|---|---|
| 4,675,246 | A | 6/1987 | Kundinger et al. |
| 4,749,625 | A | 6/1988 | Obayashi et al. |
| 4,965,408 | A | 10/1990 | Chapman et al. |
| 5,573,857 | A | 11/1996 | Auger |
| 5,645,921 | A | 7/1997 | Matsunaga et al. |
| 6,143,399 | A | 11/2000 | Kohno |
| 6,217,996 | B1 * | 4/2001 | Yamamoto ............. B32B 15/08 428/220 |
| 6,251,507 | B1 | 6/2001 | Yamamoto et al. |
| 6,548,180 | B2 | 4/2003 | Yamamoto |
| 6,808,825 | B2 | 10/2004 | Nagai et al. |
| 6,835,442 | B2 | 12/2004 | Kudo et al. |
| 7,308,752 | B2 | 12/2007 | Tanaka |
| 8,053,082 | B2 | 11/2011 | Hashimo |
| 8,557,392 | B2 | 10/2013 | Fujisawa et al. |
| 9,079,378 | B2 | 7/2015 | Kammuri |
| 9,549,471 | B2 | 1/2017 | Kammuri |
| 2002/0155021 | A1 | 10/2002 | Nagai et al. |
| 2003/0132192 | A1 | 7/2003 | Kudo et al. |
| 2004/0074655 | A1 | 4/2004 | Takahashi et al. |
| 2004/0094512 | A1 | 5/2004 | Ono et al. |
| 2007/0098910 | A1 | 5/2007 | Yamagata et al. |
| 2007/0102192 | A1 | 5/2007 | Naito et al. |
| 2009/0142607 | A1 | 6/2009 | Narui et al. |
| 2010/0269959 | A1 | 10/2010 | Gao et al. |
| 2011/0005812 | A1 | 1/2011 | Shimokawa et al. |
| 2011/0132643 | A1 | 6/2011 | Hattori et al. |
| 2011/0189501 | A1 | 8/2011 | Fujisawa et al. |
| 2012/0090887 | A1 | 4/2012 | Kanmuri |
| 2012/0107637 | A1 * | 5/2012 | Akase ............ B32B 15/08 428/607 |
| 2012/0141809 | A1 * | 6/2012 | Kanmuri ............ B32B 15/08 428/457 |
| 2013/0056258 | A1 | 3/2013 | Zhang et al. |
| 2013/0071676 | A1 | 3/2013 | Kammuri |
| 2013/0206471 | A1 * | 8/2013 | Kammuri ............ H05K 9/0083 174/394 |
| 2014/0113121 | A1 | 4/2014 | Kammuri |
| 2014/0162084 | A1 | 6/2014 | Kammuri |
| 2015/0111059 | A1 | 4/2015 | Tanaka et al. |

FOREIGN PATENT DOCUMENTS

| | | |
|---|---|---|
| EP | 2 295 489 | 3/2011 |
| EP | 2 679 384 | 5/2015 |
| JP | 59-162044 | 9/1984 |
| JP | 1-163059 | 6/1989 |
| JP | 2-097097 | 4/1990 |
| JP | H03-112643 | 5/1991 |
| JP | 04-144187 | 5/1992 |
| JP | 04-223006 | 8/1992 |
| JP | 05-283883 | 10/1993 |
| JP | Hei7-003237 | 1/1995 |
| JP | 07-058477 | 3/1995 |
| JP | A H7-101007 | 4/1995 |
| JP | HEI 07-032307 | 4/1995 |
| JP | Hei7-290449 | 11/1995 |
| JP | 1997-053162 | 2/1997 |
| JP | 09-270593 | 10/1997 |
| JP | 10-056289 | 2/1998 |
| JP | H10-058593 | 3/1998 |
| JP | 10-173385 | 6/1998 |
| JP | H11-40980 | 2/1999 |
| JP | 3009383 | 2/2000 |
| JP | 2000-101004 | 4/2000 |
| JP | 2000-182623 | 6/2000 |
| JP | 2000-212661 | 8/2000 |
| JP | 2001-011684 | 1/2001 |
| JP | 2002-019023 | 1/2002 |
| JP | 2002-144510 | 5/2002 |
| JP | 2002-217507 | 8/2002 |
| JP | 2002-249835 | 9/2002 |
| JP | 2002-319319 | 10/2002 |
| JP | 2003-096526 | 4/2003 |
| JP | 2003-193211 | 7/2003 |
| JP | 2004-060018 | 2/2004 |
| JP | 2004-256832 | 9/2004 |
| JP | 2004-360029 | 12/2004 |
| JP | 2005-004826 | 1/2005 |
| JP | 2005-015861 | 1/2005 |
| JP | 2005-068484 | 3/2005 |
| JP | 2005-191443 | 7/2005 |
| JP | 2005-248221 | 9/2005 |
| JP | 2005-344207 | 12/2005 |
| JP | 2006-240073 | 9/2006 |
| JP | 2006-272743 | 10/2006 |
| JP | 2006-324546 | 11/2006 |
| JP | 2006-326684 | 12/2006 |
| JP | 2007-110010 | 4/2007 |
| JP | 2007-146258 | 6/2007 |
| JP | 2007-207812 | 8/2007 |
| JP | 2008-088492 | 4/2008 |
| JP | 2008-120081 | 5/2008 |
| JP | 2008-166655 | 7/2008 |
| JP | 2009-108376 | 5/2009 |
| JP | 2009-111203 | 5/2009 |
| JP | 2009-161068 | 7/2009 |
| JP | 2010-006071 | 1/2010 |
| JP | 2010-37654 | 2/2010 |
| JP | 2010-100887 | 5/2010 |
| JP | 2010-194759 | 9/2010 |
| JP | 2011-20264 | 2/2011 |
| JP | 2011-152593 A | 8/2011 |
| JP | 5127086 | 1/2013 |
| JP | 5822842 B | 11/2015 |
| RU | 95110689 | 3/1997 |
| RU | 2138932 | 9/1999 |
| RU | 2303320 | 7/2007 |
| RU | 2574461 | 2/2016 |
| SU | 994306 | 2/1983 |
| WO | WO 97/04627 | 2/1997 |
| WO | WO2004/016060 | 2/2004 |
| WO | WO 2004/035303 | 4/2004 |
| WO | WO 2008/050584 | 5/2008 |
| WO | WO 2009/144973 | 12/2009 |
| WO | WO2010/113343 | 10/2010 |
| WO | WO 2011/004664 | 1/2011 |
| WO | WO 2011/121801 | 10/2011 |
| WO | WO 2012/008260 | 1/2012 |
| WO | WO 2012/132814 | 10/2012 |
| WO | WO 2012/157469 | 11/2012 |
| WO | WO 2013/105265 | 7/2013 |

OTHER PUBLICATIONS

Notice of Allowance and Fee(s) Due for U.S. Appl. No. 13/579,073 dated Sep. 12, 2016.

Official Action corresponding to U.S. Appl. No. 13/382,360 dated Jul. 29, 2016.

(56) References Cited

OTHER PUBLICATIONS

Official Action corresponding to U.S. Appl. No. 14/006,242 dated Jul. 28, 2016.
Official Action corresponding to U.S. Appl. No. 13/520,087 dated Aug. 12, 2016.
Official Action corresponding to U.S. Appl. No. 14/115,803 dated Nov. 18, 2016.
Official Action corresponding to U.S. Appl. No. 13/520,087 dated Jan. 20, 2017.
Advisory Action corresponding to U.S. Appl. No. 14/115,803 dated Apr. 5, 2017.
Advisory Action corresponding to U.S. Appl. No. 13/520,087 dated Jul. 5, 2017.
Restriction Requirement corresponding to U.S. Appl. No. 14/369,891 dated Jun. 9, 2017.
International Search Report corresponding to International Patent Application No. PCT/JP2012/050590 dated Apr. 17, 2012.
International Search Report corresponding to International Patent Application No. PCT/JP2012/050591 dated Apr. 17, 2012.
International Search Report corresponding to International Patent Application No. PCT/JP2012/055933 dated May 22, 2012.
International Search Report corresponding to International Patent Application No. PCT/JP2012/061761 dated Jul. 10, 2012.
Japanese Industrial Standard JIS C2531.
Japanese Industrial Standard JIS G3141.
Japanese Industrial Standard JIS H 3110.
Japanese Industrial Standard JIS H 4000.
Japanese Industrial Standard JIS H4551.
Japanese Industrial Standard JIS Z 2248.
Japanese Industrial Standard JIS-H0501.
Japanese Industrial Standard JIS-H3100.
Japanese Industrial Standard JIS-H3250.
Japanese Industrial Standard JIS-H3510.
Notification Concerning Transmittal of Translation of the International Preliminary Report on Patentability (Chapter I of the Patent Cooperation Treaty) corresponding to International Patent Application No. PCT/JP2012/055933 dated Oct. 8, 2013.
Notification of Transmittal of Translation of the International Preliminary Report on Patentability (Chapter I or Chapter II of the Patent Cooperation Treaty) corresponding to International Patent Application No. PCT/JP2012/050590 dated Jul. 24, 2014.
Notification of Transmittal of Translation of the International Preliminary Report on Patentability (Chapter I or Chapter II of the Patent Cooperation Treaty) corresponding to International Patent Application No. PCT/JP2012/050591 dated Jul. 24, 2014.
Notification of Transmittal of Translation of the International Preliminary Report on Patentability (Chapter I or Chapter II of the Patent Cooperation Treaty) corresponding to International Patent Application No. PCT/JP2012/061761 dated Nov. 19, 2013.
Supplementary European Search Report corresponding to Application No. 12763155.4-1308 dated Jul. 10, 2014.
Advisory Action corresponding to U.S. Appl. No. 13/579,073 dated May 18, 2016.
Arruda et al, "Effects of strain rate, temperature and thermomechanical coupling on the finite strain deformation of glassy polymers", Mechanics of Materials 19 (1995) pp. 193-212.
BASF Corporation, "Tensile Properties of Semi-Crystalline Thermoplastics-Performance Comparison under Alternative Testing Standard", Paper No. 2000-01-1319, 2003.
English translation of Decision to Grant Russian Patent Application No. 2014128526 dated Oct. 29, 2015.
Interview Summary corresponding to U.S. Appl. No. 13/520,087 dated Mar. 15, 2016.
"Materials Data Book", Cambridge University Engineering Department, p. 11 (2003).
Official Action corresponding to U.S. Appl. No. 13/520,087 dated Jan. 7, 2016.
Official Action corresponding to U.S. Appl. No. 13/382,360 dated Jan. 12, 2016.
Official Action corresponding to U.S. Appl. No. 13/579,073 dated Feb. 2, 2016.
Official Action corresponding to U.S. Appl. No. 14/006,242 dated Feb. 11, 2016.
Official Action corresponding to U.S. Appl. No. 14/115,803 dated Apr. 14, 2016.
Proszynski et al, "Measurement of stress as a function of temperature in Ag and Cu thin films", Optica Applicata, vol. XXXV, No. 3, 2005, pp. 517-522.
Restriction Requirement corresponding to U.S. Appl. No. 14/006,242 dated Nov. 16, 2015.
"Beam Deflection Formulae" <http://www.advancepipeliner.com/resources/others/beams/beam_deflection_formulae.pdf>.
Advisory Action corresponding to U.S. Appl. No. 13/254,385 dated Jun. 27, 2014.
Advisory Action corresponding to U.S. Appl. No. 13/382,360 dated Mar. 11, 2015.
Advisory Action corresponding to U.S. Appl. No. 13/579,073 dated Nov. 13, 2014.
Asaharu, N., "Member and Metho for Electromagnetically Shielding Electric Wires, or the like". Jun. 26, 1998, (JP10-173385 A), [Drawings], <http://www4.ipdl.inpit.go.jp/Tokujitu/PAJdetail.ipdl?N0000=60&N0120=01 &N2001=2&N3001=H10-173385>.
Asaharu, N., "Member and Metho for Electromagnetically Shielding Electric Wires, or the like". Jun. 26, 1998, (JP10-173385 A), [Translation of—Detailed Description], <http://www4.ipdl.inpit.go.jp/Tokujitu/PAJdetail.ipdl?N0000=60&N0120=01 &N2001=2&N3001=H10-173385>.
Autograph AGS-X Series Precision Universal Tester, Shamadzu Corporation, marketing material printed from web site www.shimadzu.com on Mar. 22, 2014.
Extended European Search Report corresponding to Application No. 12786287.8-1303 dated Oct. 16, 2014.
International Preliminary Report on Patentability corresponding to International Application No. PCT/JP2009/067886 dated Nov. 15, 2011.
International Search Report corresponding to International Patent Application No. PCT/JP2009/067886 dated Dec. 8, 2009.
International Search Report corresponding to International Patent Application No. PCT/JP2010/058975 dated Aug. 31, 2010.
International Search Report corresponding to International Patent Application No. PCT/JP2010/059416 dated Aug. 3, 2010.
International Search Report corresponding to International Patent Application No. PCT/JP2011/063770 dated Aug. 23, 2011.
Interview Summary corresponding to U.S. Appl. No. 13/254,385 dated Dec. 16, 2014.
Interview Summary corresponding to U.S. Appl. No. 13/579,073 dated Sep. 25, 2014.
Japanese Industrial Standard C2151, "Testing methods of plastic films for electrical purposes," (2006).
Japanese Industrial Standard C5016, "Test Methods for flexible printed wiring boards," Japanese Standards Association (1994).
Japanese Industrial Standards JIS K 7127, "Plastics—Determination of tensile properties—Part 3: Test conditions for films and sheets," Japanese Standards Assocation (1999).
Japanese Industrial Standard JIS Z 2241, "Metalic materials—Tensile testing—Method of test at room temperature," Japanese Standards Association (2011).
Japanese Industrial Standard JIS Z2201, "Test piece for tensile test metallic materials," Japanese Standards Association (1998).
Japanese Industrial Standard JIS Z2241, "Method of tensile test for metallic materials," Japanese Standards Association (1998).
MCXS Photovoltaic CVD, Shamadzu Corporation, marketing material printed from web site www.shimadzu.com on Mar. 24, 2014.
Notice of Allowance corresponding to U.S. Appl. No. 13/254,385 dated Apr. 6, 2015.
Notice of Grant corresponding to Russian Patent Application No. 2014128572 dated Aug. 19, 2015.
Notification of Transmittal of Translation of the International Preliminary Report on Patentability (Chapter I or Chapter II of the Patent Cooperation Treaty) corresponding to International Patent Application No. PCT/JP2011/063770 dated Feb. 21,2013.

(56) References Cited

OTHER PUBLICATIONS

Notification of Transmittal of Translation of the International Preliminary Report on Patentability corresponding to International Patent Application No. PCT/JP2010/058975 dated Dec. 13, 2012.
Notification of Transmittal of Translation of the International Preliminary Report on Patentability corresponding to International Patent Application No. PCT/JP2010/059416 dated Feb. 23, 2012.
Official Action corresponding to European Patent Application No. 11806591.1-1803 dated May 2, 2014.
Official Action corresponding to U.S. Appl. No. 13/254,385 dated Mar. 14, 2014.
Official Action corresponding to U.S. Appl. No. 13/254,385 dated May 23, 2013.
Official Action corresponding to U.S. Appl. No. 13/254,385 dated Sep. 11, 2014.
Official Action corresponding to U.S. Appl. No. 13/254,385 dated Sep. 5, 2013.
Official Action corresponding to U.S. Appl. No. 13/382,360 dated Dec. 12, 2014.
Official Action corresponding to U.S. Appl. No. 13/382,360 dated Jul. 17, 2014.
Official Action corresponding to U.S. Appl. No. 13/520,087 dated Jun. 30, 2015.
Official Action corresponding to U.S. Appl. No. 13/579,073 dated Jan. 8, 2014.
Official Action corresponding to U.S. Appl. No. 13/579,073 dated Jun. 20, 2014.
Official Action corresponding to U.S. Appl. No. 13/579,073 dated Oct. 5, 2015.
Supplementary European Search Report corresponding to European Patent Application No. 09 842 694.3-1303 / 2416639 dated Mar. 21, 2013.
Supplementary European Search Report corresponding to European Patent Application No. 10 796 975.0-1303 / 2439063 dated Apr. 4, 2013.
Supplementary European Search Report corresponding to European Patent Application No. 10848975.8-1803 dated Oct. 13, 2014.
Supplementary European Search Report corresponding to European Patent Application No. 11806591.1-1803 / 2581220 dated Apr. 15, 2014.
Supplementary European Search Report corresponding to European Patent Application No. 12865468.8-1803 dated Jul. 16, 2015.
Supplementary European Search Report corrsponding to European Patent Application No. 12865150.2-1303 dated Aug. 14, 2015.
Translation of table 1 of JPA2002-19023("Kawazu").
Trapezium Lite X data processing reference manual, No. 349-05245A, pp. 1, and 45-46.
Trapezium Lite X, Shamadzu Corporation, marketing material printed from web site www.shimadzu.com on Mar. 22, 2014.
Office Action corresponding to U.S. Appl. No. 14/369,891 dated Sep. 6, 2017.
Office Action corresponding to U.S. Appl. No. 13/520,087 dated Sep. 28, 2017.

* cited by examiner

COPPER FOIL COMPOSITE, FORMED PRODUCT AND METHOD OF PRODUCING THE SAME

FIELD OF THE INVENTION

The present invention relates to a copper foil composite comprising a copper foil and a resin layer laminated thereon, a formed product and a method of producing the same.

DESCRIPTION OF THE RELATED ART

A copper foil composite comprising a copper foil and a resin layer laminated thereon is applied to an FPC (flexible printed circuit), an electromagnetic shielding material, an RF-ID (wireless IC tag), a sheet heating element, a heat dissipators and the like. As an example of the FPC, a copper foil circuit is formed on a base resin layer, and a coverlay film for protecting the circuit overlaps the circuit to provide a laminate structure having a resin layer/a copper foil/a resin layer.

For formability of such a copper foil composite, bending properties as represented by MIT flexibility and high cycle flexibility as represented by IPC flexibility are needed. A copper foil composite having excellent bending properties and flexibility is suggested (see Patent Literatures 1 to 3). As an example, the FPC is bent and used at a movable part such as a hinge part of a mobile phone; or for space-saving of a circuit. Its deformation mode is a uniaxial flex as represented by the above-described MIT flexibility test and IPC flexibility test. Thus, the FPC is designed not for a severe deformation mode.

When the copper foil composite is used as the electromagnetic shielding material and the like, the copper foil composite includes a laminate structure having the resin layer/the copper foil. The surface of the copper foil composite is required to provide corrosion resistance and long-term stable electric contact properties.

PRIOR ART LITERATURE

Patent Literature

[Patent Literature 1] Japanese Unexamined Patent Publication No. 2010-100887
[Patent Literature 2] Japanese Unexamined Patent Publication No. 2009-111203
[Patent Literature 3] Japanese Unexamined Patent Publication No. 2007-207812

SUMMARY OF THE INVENTION

Problems to be Solved by the Invention

However, once the above-described copper foil composite is press-formed, it induces a severe (complex) deformation mode, which differs from that in the MIT flexibility test or the IPC flexibility test. It might cause a problem that the copper foil is broken. And, if the copper foil composite can be press-formed, a structure including a circuit can be tailored to fit a product shape.

Accordingly, an object of the present invention is to provide a copper foil composite having excellent formability while preventing a copper foil from broken, even if a severe (complex) deformation, which is different from a uniaxial flex, is induced by press forming, and providing corrosion resistance and electric contact properties stably for a long duration; a formed product and a method of producing the same.

Means for Solving the Problems

The present inventors found that when the deformation behavior of the resin layer is transmitted to the copper foil, the copper foil is deformed together with the resin layer, whereby the copper foil is hardly constricted, the ductility is increased and the crack of the copper foil is prevented. Thus, the present invention is attained. In other words, the properties of the resin layer and the copper foil are specified so that the deformation behavior of the resin layer is transmitted to the copper foil. In addition, a coating layer on the surface of the copper foil is specified so that corrosion resistance and electric contact properties are provided stably for a long duration.

That is, the present invention provides a copper foil composite comprising a copper foil and a resin layer laminated thereon, satisfying an equation 1: $(f_3 \times t_3)/(f_2 \times t_2) \Rightarrow 1$ wherein $t_2$ (mm) is a thickness of the copper foil, $f_2$ (MPa) is a stress of the copper foil under tensile strain of 4%, $t_3$ (mm) is a thickness of the resin layer, $f_3$ (MPa) is a stress of the resin layer under tensile strain of 4%, and an equation 2: $1 \leq 33 f_1/(F \times T)$ wherein $f_1$ (N/mm) is 180° peeling strength between the copper foil and the resin layer, F(MPa) is strength of the copper foil composite under tensile strain of 30%, and T (mm) is a thickness of the copper foil composite, wherein a Cr oxide layer is formed at an coating amount of 5 to 100 $\mu g/dm^2$ is formed on a surface of the copper foil on which the resin layer is not laminated.

Preferably, a Ni layer or a Ni alloy layer having a thickness of 0.001 to 5.0 $\mu m$ is formed between the Cr oxide layer and the copper foil. Preferably, the thickness of the Ni layer or the Ni alloy layer is 0.001 to 0.10 $\mu m$.

Preferably, the equations 1 and 2 are true at the temperature lower than the glass transition temperature of the resin layer.

Preferably, a ratio I/L of fracture strain I of the copper foil composite to fracture strain L of the resin layer alone is 0.7 to 1.

Also, the present invention provides a formed product obtained by working the copper foil composite. The formed product of the present invention can be worked sterically, for example, by a press working, bulging using a top and a bottom dies, other working with drawing.

Also, the present invention provides a method of producing a formed product comprising working the copper foil composite.

Effect of the Invention

According to the present invention, there can be provided a copper foil composite having excellent formability while preventing a copper foil from broken even if a severe (complex) deformation, which is different from a uniaxial flex, is induced by press forming, and providing corrosion resistance and long-term stable electric contact properties.

DETAILED DESCRIPTION OF THE INVENTION

The copper foil composite of the present invention comprises a copper foil and a resin layer laminated thereon. Non-limiting example of the usage of the copper foil composite of the present invention includes an FPC (flexible printed circuit), an electromagnetic shielding material, an RF-ID (wireless IC tag), a sheet heating element, a heat dissipator.

<Copper Foil>

The thickness $t_2$ of the copper foil is preferably 0.004 to 0.05 mm (4 to 50 μm). When the $t_2$ is less than 0.004 mm (4 μm), the ductility of the copper foil is significantly decreased, and the formability of the copper foil composite may not be improved. It is preferable that the fracture strain of the copper foil be 4% or more. When the $t_2$ exceeds 0.05 mm (50 μm), the properties belonging to the copper foil alone significantly appear on the copper foil composite, and the formability of the copper foil composite may not be improved.

As the copper foil, a rolled copper foil, an electro-deposited copper foil, a metallized copper foil and the like can be used. The rolled copper foil is preferable, in that it has excellent formability based on recrystallization and can decrease strength ($f_2$). When a treated layer is formed on the surface of the copper foil in order to provide adhesion properties and rust prevention, the treated layer is considered to be included in the copper foil.

<Resin Layer>

The resin layer is not especially limited. The resin layer may be formed by applying a resin material to the copper foil. Preferably, the resin film can be adhered to the copper foil. Examples of the resin film include a PET (polyethylene terephthalate) film, a PEN (polyethylene naphthalate), a PI (polyimide) film, an LCP (liquid crystal polymer) film and a PP (polypropylene) film.

For the lamination of the resin film and the copper foil, an adhesive agent may be used between the resin film and the copper foil, or the resin film may be thermally compressed on the resin film. When the strength of the adhesive agent layer is low, the formability of the copper foil composite is difficult to be improved. It is therefore preferable that the strength of the adhesive agent layer be ⅓ or more of the stress ($f_3$) of the resin layer. Since the technical idea of the present invention is to improve the ductility by transmitting the deformation behavior of the resin layer to the copper foil, by deforming the copper foil similar to the resin layer, and by preventing the necking of the copper foil. Thus, the adhesive agent layer may not be well deformed when the strength of the adhesive agent layer is low, and the behavior of the resin is not transmitted to the copper foil.

When the adhesive agent is used, the properties of the resin layer are intended to include those of the adhesive agent layer and the resin layer, as described later.

The thickness $t_3$ of the resin layer is preferably 0.012 to 0.12 mm (12 to 120 μm). When the $t_3$ is less than 0.012 mm (12 μm), $(f_3 \times t_3)/(f_2 \times t_2)$ may be <1. When the $t_3$ exceeds 0.12 mm (120 μm), the flexibility of the resin layer is decreased, the stiffness becomes too high, and the formability is degraded. It is preferable that the fracture strain of the resin layer be 40% or more.

<Copper Foil Composite>

The combination of the copper foil composite comprising the copper foil and the resin layer laminated thereon described above includes a two-layer structure such as the copper foil/the resin layer or a three-layer structure such as the copper foil/the resin layer/the copper foil. In case of (the copper foil/the resin layer/the copper foil) where the copper foils are disposed on both sides of the resin layer, the total value of ($f_2 \times t_2$) is obtained by adding each value of ($f_2 \times t_2$) calculated about the two copper foils.

<180° Peeling Strength>

Since the copper foil is thin, necking is easily occurred in a thickness direction. When the necking is produced, the copper foil is broken and the ductility is therefore decreased. On the other hand, the resin layer has a property that the necking is difficult to be produced when tension is applied (i.e., the resin layer has a wide area with uniform strain). Thus, in the composite comprising the copper foil and the resin layer, when the deformation behavior of the resin layer is transmitted to the copper foil, the copper foil is deformed together with the resin layer, the necking of the copper foil is hardly occurred, and the ductility is increased. When the adhesion strength between the copper foil and the resin layer is low, the deformation behavior of the resin layer cannot be transmitted to the copper foil, so the ductility is not improved (the copper foil is peeled or cracked).

Then, high adhesion strength is needed. Shear bond strength is considered to be a direct indicator of the adhesion strength. If the adhesion strength is increased such that the shear bond strength has a similar level to strength of the copper foil composite, the area other than the bonding surface is broken to make a measurement difficult.

In view of the above, the value $f_1$ of 180° peeling strength is used. Although the absolute values of the shear bond strength and the 180° peeling strength are totally different, there is a correlation between the formability, tensile elongation and the 180° peeling strength. So, the 180° peeling strength is deemed as an indicator of the adhesion strength.

In fact, it is considered that "the strength at the time of the material is broken" is equal to "the shear bond strength." As an example, it is considered that when 30% or more of the tensile strain is required, "30% of a flow stress<=shear bond strength." When 50% or more of the tensile strain is required, "50% of a flow stress<=shear bond strength." According to the experiments by the present inventors, the formability was excellent when the tensile strain exceeded 30% or more. So, the strength obtained when the tensile strain is 30% is defined as the strength F of the copper foil composite, as described later.

Figure 1:
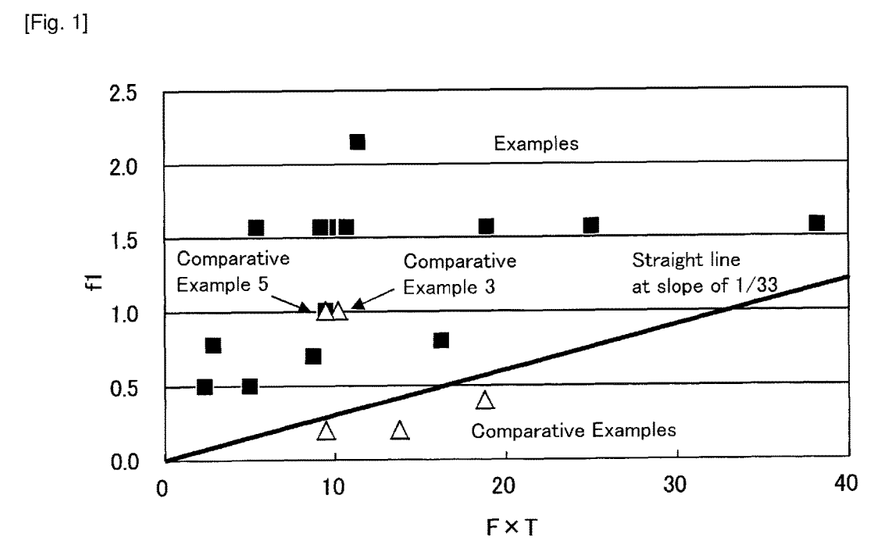
FIG. 1 is a graph showing a relationship between $f_1$ and (F×T) obtained by experiments.

FIG. 1 is a graph showing a relationship between $f_1$ and (F×T) obtained by experiments, and plots the value of $f_1$ and (F×T) in each Example and Comparative Example. (F×T) is the strength applied to the copper foil composite under tensile strain of 30%. If this is regarded as the minimum shear bond strength required for increasing the formability, $f_1$ and (F×T) are correlated at the slope of 1 as long as the absolute values of these are same.

However, in FIG. 1, the values of $f_1$ and (F×T) in all data are not correlated similarly. In each Comparative Example with poor formability, the coefficient of correlation $f_1$ to (F×T) (in other words, the slope of $f_1$ to (F×T) from the origin point in FIG. 1) is gentle, and the 180° peeling strength is correspondingly poor. On the other hand, the slope of each Example is greater than that of each Comparative Example. The slope of Example 18 (just broken under the strain of 30%) is gentlest and is ⅓₃. Thus, this value is regarded as the correlation function between the minimum shear bond strength and the 180° peeling strength required for increasing the formability. In other words, it is considered that the shear bond strength is 33 times greater than the 180° peeling strength.

In Comparative Example 3, the slope in FIG. 1 exceeds ⅓₃. However, an equation 1: $(f_3 \times t_3)/(f_2 \times t_2)$ described later is less than 1, which results in the poor formability.

The 180° peeling strength is represented by force per unit width (N/mm).

When the copper foil composite has a three-layer structure including a plurality of bonding surfaces, the lowest value of the 180° peeling strength out of the bonding surfaces is used. This is because the weakest bonding surface is peeled.

In order to increase the adhesion strength between the copper foil and the resin layer, a Cr oxide layer is formed on the surface of the copper foil (on the surface of the resin layer, herein referred to as a "bonding surface" for convenience) by a chromate treatment and so on, the surface of the copper foil is roughened, or the Cr oxide layer is disposed after the surface of the copper foil is coated with Ni or an Ni alloy layer. As described later, a Cr oxide layer is formed on the surface (non-bonding surface) of the copper foil opposite to the resin layer. Also, the Cr oxide layer may be formed simultaneously on the bonding surface in the same step as the Cr oxide layer is formed on the non-bonding surface.

The thickness of the Cr oxide layer on the bonding surface may be 5 to 100 µg/dm² based on the weight of Cr. The thickness is calculated from the Cr content by wet analysis. The presence of the Cr oxide layer can be determined by X-ray photoelectron spectroscopy (XPS) for detecting Cr. (The peak of Cr is shifted by oxidation.)

The thickness of the Ni or the Ni alloy on the bonding surface may be 0.001 to 5.0 µm. If the thickness of a Ni coating exceeds 5.0 µm, the ductility of the copper foil (and the copper foil composite) may be lowered.

Furthermore, the adhesion strength can be increased by changing the pressure and the temperature conditions when the copper foil and the resin layer are laminated and combined. Insofar as the resin is not damaged, both of the pressure and the temperature upon lamination may be increased.

The Cr oxide layer is formed on the surface on the copper foil on which the resin layer is not laminated at the coating amount of 5 to 100 µg/dm² in order to add the corrosion resistance.

If the coating amount of the Cr oxide layer is less than the lower limit, the corrosion resistance of the copper foil cannot be provided. On the other hand, the greater the coating amount of the Cr oxide layer is, the more the corrosion resistance is improved. However, as the advantageous effects are saturated and the costs are increased, the upper limit is determined. The coating amount of the Cr oxide layer is preferably 10 to 80 µm/dm², more preferably 15 to 50 µm/dm².

In order to provide the long-term stable electric contact properties and the heat resistance, it is preferable that the Ni layer or the Ni alloy layer having the thickness of 0.001 to 5.0 µm be formed between the above-mentioned Cr oxide layer and the copper foil (on the resin layer). If the thickness of the layer is less than 0.001 µm, stable electric contact properties cannot be provided. The thicker the layer is, the more the stability of the electric contact properties is improved. However, if the thickness exceeds 5.0 µm, the advantageous effects are saturated. The thickness of the Ni layer or the Ni alloy layer is more preferably 0.001 to 0.5 µm, still more preferably 0.001 to 0.06 µm. Preferably, the Ni alloy layer contains 50 wt % or more of Ni and one or more of Zn, Sn, Co, Cr, Mn, V, P, B, W, Mo and Fe; the balance being incidental impurities.

<$(f_3 \times t_3)/(f_2 \times t_2)$>

Next, the meaning of $((f_3 \times t_3)/(f_2 \times t_2))$ (hereinafter referred to as "equation 1") in claims will be described. Since the copper foil composite comprises the copper foil and the resin layer laminated thereon, which have the same width (size), the equation 1 represents a ratio of the force applied to the copper foil to the force applied to the resin layer in the copper foil composite. When the ratio is 1 or more, much force is applied to the resin layer and the resin layer is stronger than the copper foil. As a result, the copper foil does not broken and exhibits good formability.

When $(f_3 \times t_3)/(f_2 \times t_2) < 1$, too much force is applied to the copper foil, and the above-mentioned effects do not provided, i.e., the deformation behavior of the resin layer is not transmitted to the copper foil, and the copper foil is not deformed together with the resin.

Here, $f_2$ and $f_3$ may be the stress at the same strain amount after plastic deformation is induced. In consideration of the fracture strain of the copper foil and the strain at the time of starting the plastic deformation of the resin layer (for example, PET film), $f_2$ and $f_3$ are set to the tensile strain of 4%. The values $f_2$ and $f_3$ (and $f_1$) are all obtained in a MD (machine direction).

<$33f_1/(F \times T)$>

Then, the meaning of $(33f_1/(F \times T)$ (hereinafter referred to as "equation 2") in claims will be described. As described above, the minimum shear bond strength which directly shows the minimum adhesion strength between the copper foil and the resin layer required for increasing the formability is about 33 times greater than the 180° peeling strength $f_1$. In other words, $33f_1$ represents the minimum adhesion strength required for improving the formability of the copper foil and the resin layer. On the other hand, $(F \times T)$ is the strength applied to the copper foil composite, and the equation 2 represents a ratio of the adhesion strength between the copper foil and the resin layer to tensile force of the copper foil composite. When the copper foil composite is pulled, a shear stress is induced by the copper foil to be deformed locally and the resin to be subjected to uniform tensile strain at an interface between the copper foil and the resin layer. Accordingly, when the adhesion strength is lower than the shear stress, the copper and the resin layer are peeled. As a result, the deformation behavior of the resin layer cannot be transmitted to the copper foil, and the ductility of the copper foil is not improved.

In other words, when the ratio in the equation 2 is less than 1, the adhesion strength is lower than the force applied to the copper foil composite, and the copper foil and the resin tend to be easily peeled. Then, the copper foil may be broken by processing such as press forming.

When the ratio in the equation 2 is 1 or more, the copper and the resin layer are not peeled, and the deformation behavior of the resin layer can be transmitted to the copper foil, thereby improving the ductility of the copper foil. The higher ratio in the equation 2 is preferable. However, it is generally difficult to provide the value of 10 or more. The upper limit in the equation 2 may be 10.

In addition, it is considered that the higher formability is, the higher the value of $33f_1/(F \times T)$ is. However, the tensile strain I of the resin layer is not proportional to $33f_1/(F \times T)$. This is because the effects of the magnitude of $(f_3 \times t_3)/(f_2 \times t_2)$ and the ductility of the copper foil or the rein layer alone. However, the combination of the copper foil and the resin layer satisfying the equations: $33f_1/(F\times T)=>1$ and $(f_3\times t_3)/(f_2\times t_2)=>1$ can provide the composite having the required formability.

Here, the reason for using the strength obtained when the tensile strain is 30% as the strength F of the copper foil composite is that the formability was excellent when the tensile strain exceeded 30% or more, as described above. Another reason is as follows: When the copper foil composite was subjected to a tensile test, a great difference was produced in the flow stress due to the strain until the tensile strain reached 30%. However, no great difference was produced in the flow stress due to the strain after the tensile strain reached 30% (although the copper foil composite was somewhat work hardened, the slope of the curve became gentle).

When the tensile strain of the copper foil composite is less than 30%, the tensile strength of the copper foil composite is defined as F.

As described above, the copper foil composite of the present invention has excellent formability while preventing a copper foil from broken even if a severe (complex) forming, which is different from a uniaxial flex, is made by press and so on. In particular, the present invention is suitable for three-dimensional molding including press molding. When the copper foil composite is three-dimensional formed, the copper foil composite can have a complex shape and improved strength. For example, the copper foil composite itself can be a housing used in various power circuits, resulting in decreased the number of parts and costs.

<I/L>

The ratio I/L of fracture strain I of the copper foil composite to fracture strain L of the resin layer alone is preferably 0.7 to 1.

In general, the tensile fracture strain of the resin layer is significantly higher than that of the copper foil. Similarly, the tensile fracture strain of the resin layer alone is significantly higher than that of the copper foil composite. On the other hand, according to the present invention, the deformation behavior of the resin layer is transmitted to the copper foil, so that the ductility of the copper foil is improved, as described above. The tensile fracture strain of the copper foil composite can be correspondingly enhanced to 70 to 100% of the tensile fracture strain of the resin layer alone. When the ratio I/L is 0.7 or more, the press formability can be further improved.

The tensile fracture strain I of the copper foil composite is the tensile fracture strain obtained by the tensile test. And, when both the resin layer and the copper foil are broken at the same time, the value of this point is defined as the tensile fracture strain. When the copper foil is broken first, the value when the copper foil is broken is defined as the tensile fracture strain.

<Tg of Resin Layer>

Typically, the resin layer has decreased strength and adhesion strength at high temperature. So, it is difficult to satisfy $(f_3\times t_3)/(f_2\times t_2)=>1$ and $1<=33f_1/(F\times T)$ at high temperature. Specifically, at the glass transition temperature (Tg) or more of the resin layer, the strength and the adhesion strength of the resin layer may be difficult to be kept. At the temperature lower than Tg, the strength and the adhesion strength of the resin layer tend to be easily kept. In other words, at the temperature lower than the glass transition temperature (Tg) (e.g. 5° C. to 215° C.) of the resin layer, the copper foil composite easily satisfies $(f_3\times t_3)/(f_2\times t_2)=>1$ and $1<=33f_1/(F\times T)$. Here, at the higher temperature but lower than Tg, the strength and the adhesion strength of the resin layer may be decreased and satisfying the equations 1 and 2 tends to be difficult (see Examples 17 to 19 described later).

When the equations 1 and 2 are satisfied, it is found that the ductility of the copper foil composite can be maintained even at relatively high temperature (e.g., 40° C. to 215° C.) lower than Tg of the resin layer. If the ductility of the copper foil composite can be maintained even at relatively high temperature (e.g., 40° C. to 215° C.) but lower than Tg of the resin layer, excellent formability is shown even in a warm press forming. It is preferable that the temperature be higher for providing the resin layer with the good formability. Further, the copper foil composite is warm pressed to retain the shape after pressing (not to return to the original by elastic deformation). From this point of view, it is preferable that the ductility of the copper foil composite can be maintained at relatively high temperature (e.g., 40° C. to 215° C.) but lower than Tg of the resin layer.

If the copper foil composite comprises the adhesive agent layer and the resin layer, the lowest glass transition temperature (Tg) of the layer is used.

EXAMPLE

<Production of Copper Foil Composite>

A tough-pitch copper ingot was hot-rolled, was surface grinded to remove oxides, was cold-rolled, was annealed and acid-pickled repeatedly to reduce the thickness $t_2$ (mm) as shown in Table 1, was finally annealed to ensure the formability, and was rust-proofed using benzotriazole, whereby each copper foil was provided. A tension upon cold-rolling and rolling reduction conditions of the rolled material in a width direction were uniform so that the copper foil had uniform texture in the width direction. In the next annealing, a plurality of heaters were used to control the temperature so that a uniform temperature distribution was attained in the width direction, and the temperature of the copper was measured and controlled.

Furthermore, both surfaces of each resultant copper foil were surface-treated as shown in Table 1. Thereafter, each resin film (resin layer) shown in Table 1 was laminated thereon by vacuum pressing (pressing pressure of 200 $N/cm^2$) at a temperature of (Tg of the resin layer+50° C.) or more to produce each copper foil composite having each layer structure shown in Table 1. In Example 5, an adhesive agent was used to laminate the copper foil and the resin film, thereby producing the copper foil composite.

In Table 1, Cu represents a copper foil, PI represents a polyimide film, and PET represents a polyethylene terephtalate film. Tgs of PI and PET were 220° C. and 70° C.

On one surface of the copper foil (a surface not adhered to the resin layer), each coating layer shown in Table 1 was formed. And an opposite surface of the copper foil (a surface adhered to the resin layer) was surface-treated shown in Table 1. The conditions of the surface treatment were as follows:

Chromate treatment: a chromate bath ($K_2Cr_2O_7$:0.5 to 5 g/L) was used, and electrolytic treatment was conducted at current density of 1 to 10 $A/dm^2$. The Cr oxide layer coating amount was set to be 35 $\mu g/dm^2$.

Ni coating+chromate treatment: a Ni plating bath (Ni ion concentration: 1 to 30 g/L Watts bath) was used, Ni plating was conducted at a plating bath temperature of 25 to 60° C. and at current density of 0.5 to 10 $A/dm^2$, and the chromate treatment was then conducted as described above. The thickness of the Ni coating was set to 0.010 $\mu m$.

Roughening treatment: a treatment liquid (Cu: 10 to 25 g/L, H2SO4: 20 to 100 g/L) was used, and electrolytic treatment was conducted at a temperature of 20 to 40° C. and at current density of 30 to 70 A/dm² for 1 to 5 seconds. Thereafter, a Ni—Co plating liquid (Co ion concentration: 5 to 20 g/L, Ni ion concentration: 5 to 20 g/L, pH: 1.0 to 4.0) was used to conduct Ni—Co plating at a temperature of 25 to 60° C. and at current density of 0.5 to 10 A/dm².

The Cr oxide layer and the Ni layer were formed on the non-bonding surface of the copper foil under the same conditions as the above-mentioned chromate treatment and the Ni coating. For example, "Ni (0.006 μm)/Cr oxide layer (35 μg/dm2)" in Example 20 shown in Table 1 refers that the Ni layer having a thickness of 0.006 μm was formed on the non-bonding surface of the copper foil, and the Cr oxide layer was formed on the surface of the Ni layer at coating amount of 35 μg/dm2.

In Example 6, a Ni—Zn layer was formed at a thickness of 0.030 μm on the non-bonding surface of the copper foil, and Cr oxide layer was formed on the surface of the Ni—Zn layer at a coating amount of 35 μg/dm². The Ni—Zn layer was formed using a Ni—Zn plating bath (Ni ion concentration: 15 to 20 g/L, Zn ion concentration: 10 to 20 g/L) was used and the conditions of the plating liquid temperature of 50° C. and a current density of 4.0 A/dm² were used. As a result of analyzing the Ni—Zn layer, the alloy composition was Ni:Zn=75:25 (wt %).

In Example 7, a Ni—P layer was formed at a thickness of 0.030 μm on the non-bonding surface of the copper foil, and Cr oxide layer was formed on the surface of the Ni—P layer at a coating amount of 35 μg/dm². The Ni—P layer was formed using a Ni—P plating bath (Ni ion concentration: 15 to 20 g/L, P ion concentration: 5 g/L) to conduct plating at a plating liquid temperature of 50 to 60° C. and at current density of 4 A/dm². As a result of analyzing the Ni—P layer, the alloy composition was Ni:P=95:5 (wt %).

In Example 8, a Ni—Sn layer was formed at a thickness of 0.030 μm on the non-bonding surface of the copper foil, and Cr oxide layer was formed on the surface of the Ni—Sn layer at a coating amount of 35 μg/dm². The Ni—Sn layer was formed using a Ni—Sn plating bath (Ni ion concentration: 15 to 20 g/L, Sn ion concentration: 10 to 15 g/L) was used to conduct plating at a plating liquid temperature of 45° C. and at current density of 4.0 A/dm². As a result of analyzing the Ni—Sn layer, the alloy composition was Ni:Sn=80:20 (wt %).

The coating amount of the Cr oxide layer and each thickness of the Ni layer and the Ni alloy layer were determined by dissolving a 100 mm×100 mm copper foil on which these layers were formed into a mixed solution of $HNO_3$ (2% by weight) and HCl (5% by weight) to quantify each metal concentration in the solution by an ICP emission spectrophotometer (manufactured by SII Nano Technology Inc., SFC-3100), and to calculate an coating amount (μg/dm²) per unit area. The thickness of the Ni or Ni—Zn layer was calculated from a coating amount per unit area. Each sample was measured for 5 times, and an average value was taken as the coating amount (thickness).

The mass of each metal determined quantitatively by the above-described method was converted into each thickness of the Ni layer and the Ni alloy layer using known specific gravity.

<Tensile Test>

A plurality of strip test specimens each having a width of 12.7 mm were produced from the copper foil composite. As to the copper foil and the resin film of the tensile test, 12.7 mm wide strip test specimens were produced from the copper foil alone and the resin film alone before lamination. Using a tensile tester, the tensile test was conducted in a direction parallel to the rolling direction of the copper foil in accordance with JIS-Z2241. The test temperature upon each tensile test is shown in Table 1.

<180° Peel Test>

A 180° peel test was conducted to measure the 180° peeling strength $f_1$. A plurality of peel test specimens each having a width of 12.7 mm were produced from the copper foil composite. The surface of the copper foil in the test specimen was fixed on a SUS plate, and the resin layer was peeled in a direction at an angle of 180°. In Examples where the copper foils were disposed on both surfaces of the resin layer, after the copper foil at one surface was removed, the copper foil on the opposite surface was fixed on the SUS plate and the resin layer was peeled in a direction at angle of 180°. The other conditions were in accordance with JIS-05016.

Although the copper foil layer was peeled in accordance with JIS standard, the resin layer was peeled in Examples in order to minimize the effects of the thickness and the stiffness of the copper foil.

<Evaluation of Formability>

Figure 2:
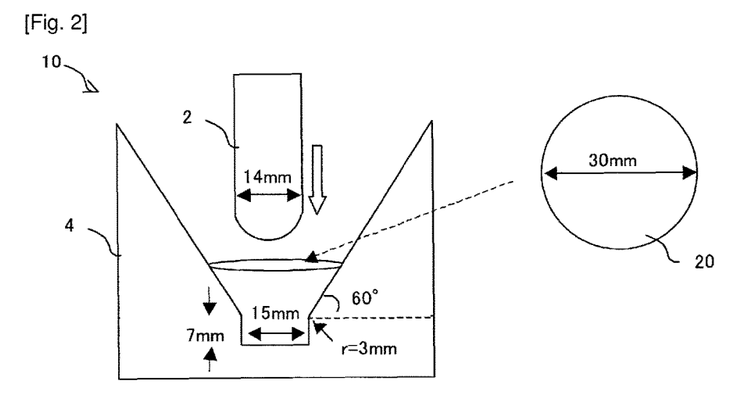
FIG. 2 shows a schematic configuration of a cup test device for evaluating the formability.

The formability was evaluated using a cup test device 10 shown in FIG. 2. The cup test device 10 comprised a pedestal 4 and a punch 2. The pedestal 4 had a frustum slope. The frustum was tapered from up to down. The frustum slope was tilted at an angle of 60° from a horizontal surface. The bottom of the frustum was communicated with a circular hole having a diameter of 15 mm and a depth of 7 mm. The punch 2 was a cylinder and had a tip in a semispherical shape with a diameter of 14 mm. The semispherical tip of the punch 2 could be inserted into the circular hole of the frustum.

A connection part of the tapered tip of the frustum and the circular hole at the bottom of the frustum was rounded by a radius (r)=3 mm.

The copper foil composite was punched out to provide the test specimen 20 in a circular plate shape with a diameter of 30 mm, and was disposed on the slope of the frustum of the pedestal 4. The punch 2 was pushed down on the top of the test specimen 20 to insert it into the circular hole of the pedestal 4. Thus, the test specimen 20 was formed in a conical cup shape.

In the case the resin layer was disposed on one surface of the copper foil composite, the copper foil composite was disposed on the pedestal 4 such that the resin layer was faced upward. In the case the resin layers were disposed on both surfaces of the copper foil composite, the copper foil composite was disposed on the pedestal 4 such that the resin layer bonded to the M surface was faced upward. In the case the both surfaces of the copper foil composite were made of Cu, either surface might be faced upward.

After molding, the crack of the copper foil in the test specimen 20 was visually identified. The formability was evaluated the following scales:

Excellent: the copper foil was not cracked and had no wrinkles.

Good: the copper foil was not cracked but had some wrinkles.

Not Good: the copper foil was cracked.

<Evaluation of Corrosion Resistance>

Salt water having a sodium chloride concentration of 5±1 wt %, pH=6.5 to 7.2 at 35±2° C. and pressure of 98±10 KPa was sprayed onto the surface of the copper foil laminate on which the resin layer was not laminated for 460 hours, and then appearance was visually observed. Presence or absence of the copper foil component on the surface was analyzed using XPS.

Excellent: the copper foil was not tarnished and was not exposed (no copper foil component was detected from the surface)

Good: the copper foil was whitely tarnished and not exposed (no copper foil component was detected from the surface)

Not Good: the copper foil was blackly tarnished by oxidation, or tarnished to green by rust; the copper foil was exposed (a copper foil component was detected from the surface)

<Evaluation of Electric Contact Properties>

Contact resistance on the surface of the copper foil on which the resin layer was not laminated was measured after each test specimen was heated at 180° C. for 1000 hours in the atmosphere. The measurement was conducted using an electric contact simulator CRS-1 manufactured by Yamazaki Seiki Co., Ltd. by the four terminal method. Probe: gold probe, contact load: 40 g, sliding speed: 1 mm/min and sliding distance: 1 mm.

Good: contact resistance was less than 10 mΩ

Not good: contact resistance was 10 mΩ or more

The results are shown in Tables 1 and 2. The test temperatures in Table 1 show the temperatures of the evaluation of F, $f_1$, $f_2$, $f_3$ and formability.

TABLE 1

| | Surface treatment of copper foil at resin layer side | Coating layer on copper foil surface opposite to resin layer (attached amount of thickness) | Pressing pressure upon lamination (N/cm2) | Structure of coppre foil composite | Tg of resin layer (° C.) | Test temperature (° C.) | F (MPa) | T (mm) | f1 (N/mm) | f2 (MPa) | t2 (mm) | f3 (MPa) | t3 (mm) |
|---|---|---|---|---|---|---|---|---|---|---|---|---|---|
| Example 1 | Roughening treatment | Cr oxide layer(35 μg/dm2) | 200 | Cu/PET | 70 | 25 | 170 | 0.067 | 2.15 | 128 | 0.017 | 80 | 0.050 |
| Example 2 | Chromate treatment | Cr oxide layer(35 μg/dm2) | 200 | Cu/PET | 70 | 25 | 141 | 0.067 | 1.01 | 128 | 0.017 | 80 | 0.050 |
| Example 3 | Ni coating + Chromate treatment | Cr oxide layer(35 μg/dm2) | 200 | Cu/PET | 70 | 25 | 150 | 0.067 | 1.57 | 128 | 0.017 | 80 | 0.050 |
| Example 4 | Bonding agent | Cr oxide layer(35 μg/dm2) | 200 | Cu/PET | 70 | 25 | 118 | 0.020 | 0.50 | 115 | 0.008 | 80 | 0.012 |
| Example 5 | Ni coating + Chromate treatment | Cr oxide layer(10 μg/dm2) | 200 | Cu/PET | 70 | 25 | 137 | 0.067 | 1.57 | 128 | 0.017 | 80 | 0.050 |
| Example 6 | Ni—Zn(0.030 μm)/Cr oxide treatment | Cr oxide layer(35 μg/dm2) | 200 | Cu/PET | 70 | 25 | 137 | 0.067 | 1.57 | 128 | 0.017 | 80 | 0.050 |
| Example 7 | Ni—P(0.030 μm) + Chromate treatment | Cr oxide layer(35 μg/dm2) | 200 | Cu/PET | 70 | 25 | 137 | 0.067 | 1.57 | 128 | 0.017 | 80 | 0.050 |
| Example 8 | Ni—Sn(0.030 μm) + Chromate treatment | Cr oxide layer(35 μg/dm2) | 200 | Cu/PET | 70 | 25 | 137 | 0.067 | 1.57 | 128 | 0.017 | 80 | 0.050 |
| Example 9 | Ni coating + Chromate treatment | Cr oxide layer(75 μg/dm2) | 200 | Cu/PET | 70 | 25 | 137 | 0.067 | 1.57 | 128 | 0.017 | 80 | 0.050 |
| Example 10 | Ni coating + Chromate treatment | Cr oxide layer(95 μg/dm2) | 200 | Cu/PET | 70 | 25 | 137 | 0.067 | 1.57 | 128 | 0.017 | 80 | 0.050 |
| Example 11 | Ni coating + Chromate treatment | Cr oxide layer(35 μg/dm2) | 200 | Cu/PET | 70 | 25 | 123 | 0.044 | 1.57 | 125 | 0.012 | 80 | 0.032 |
| Example 12 | Ni coating + Chromate treatment | Cr oxide layer(35 μg/dm2) | 200 | Cu/PET | 70 | 25 | 140 | 0.067 | 1.57 | 128 | 0.017 | 80 | 0.050 |
| Example 13 | Ni coating + Chromate treatment | Cr oxide layer(35 μg/dm2) | 200 | Cu/PET | 70 | 25 | 140 | 0.135 | 1.57 | 110 | 0.035 | 80 | 0.100 |
| Example 14 | Ni coating + Chromate treatment | Cr oxide layer(35 μg/dm2) | 200 | Cu/PET | 70 | 25 | 119 | 0.210 | 1.57 | 120 | 0.035 | 80 | 0.175 |
| Example 15 | Ni coating + Chromate treatment | Cr oxide layer(35 μg/dm2) | 200 | Cu/PET | 70 | 25 | 134 | 0.285 | 1.57 | 120 | 0.035 | 80 | 0.250 |
| Example 16 | Ni coating + Chromate treatment | Cr oxide layer(35 μg/dm2) | 200 | Cu/PI | 220 | 25 | 144 | 0.067 | 1.57 | 128 | 0.017 | 100 | 0.050 |
| Example 17 | Ni coating + Chromate treatment | Cr oxide layer(35 μg/dm2) | 200 | Cu/PET | 70 | 50 | 120 | 0.135 | 0.80 | 120 | 0.035 | 80 | 0.100 |
| Example 18 | Ni coating + Chromate treatment | Cr oxide layer(35 μg/dm2) | 200 | Cu/PI | 220 | 150 | 130 | 0.067 | 0.70 | 128 | 0.017 | 100 | 0.050 |
| Example 19 | Ni coating + Chromate treatment | Cr oxide layer(35 μg/dm2) | 200 | Cu/PI | 220 | 200 | 75 | 0.067 | 0.50 | 128 | 0.017 | 100 | 0.050 |
| Example 20 | Ni coating + Chromate treatment | Cr oxide layer(35 μg/dm2) | 200 | Cu/PET/Cu | 70 | 25 | 160 | 0.067 | 1.57 | 128 | 0.017 | 80 | 0.050 |
| Example 21 | Ni coating + Chromate treatment | Cr oxide layer(35 μg/dm2) | 200 | Cu/PI/Cu | 220 | 25 | 160 | 0.067 | 1.57 | 128 | 0.017 | 100 | 0.050 |
| Example 22 | Ni coating + Chromate treatment | Ni(0.006 μm)/Cr oxide layer(35 μg/dm2) | 200 | Cu/PET | 70 | 25 | 137 | 0.067 | 1.57 | 128 | 0.017 | 80 | 0.050 |
| Example 23 | Ni coating + Chromate treatment | Ni(0.030 μm)/Cr oxide layer(35 μg/dm2) | 200 | Cu/PET | 70 | 25 | 137 | 0.067 | 1.57 | 128 | 0.017 | 80 | 0.050 |
| Example 24 | Ni coating + Chromate treatment | Ni(0.090 μm)/Cr oxide layer(35 μg/dm2) | 200 | Cu/PET | 70 | 25 | 137 | 0.067 | 1.57 | 128 | 0.017 | 80 | 0.050 |
| Example 25 | Ni coating + Chromate treatment | Ni(1.0 μm)/Cr oxide layer(35 μg/dm2) | 200 | Cu/PET | 70 | 25 | 137 | 0.067 | 1.57 | 128 | 0.017 | 80 | 0.050 |
| Example 26 | Ni coating + Chromate treatment | Ni(4.5 μm)/Cr oxide layer(35 μg/dm2) | 200 | Cu/PET | 70 | 25 | 137 | 0.067 | 1.57 | 128 | 0.017 | 80 | 0.050 |
| Comparative Example 1 | No | Cr oxide layer(35 μg/dm2) | 200 | Cu/PI | 220 | 25 | 158 | 0.087 | 0.20 | 120 | 0.035 | 137 | 0.052 |
| Comparative Example 2 | No | Cr oxide layer(35 μg/dm2) | 100 | Cu/PI | 220 | 25 | 139 | 0.135 | 0.40 | 120 | 0.035 | 100 | 0.100 |
| Comparative Example 3 | Chromate treatment | | 200 | Cu/PI | 220 | 25 | 120 | 0.085 | 1.01 | 140 | 0.035 | 87 | 0.050 |
| Comparative Example 4 | No | Cr oxide layer(35 μg/dm2) | 100 | Cu/PI | 220 | 25 | 70 | 0.135 | 0.20 | 111 | 0.035 | 43 | 0.100 |
| Comparative Example 5 | Chromate treatment | Cr oxide layer(3 μg/dm2) | 200 | Cu/PI | 220 | 25 | 70 | 0.135 | 1.01 | 111 | 0.035 | 43 | 0.100 |

TABLE 2

| | t3 (mm) | 33 * f1/ (F × T) | (f3 × t3)/ (f2 × t2) | L | I | I/L | Workability | Corrosion resistance | Electric contact properties |
|---|---|---|---|---|---|---|---|---|---|
| Example 1 | 0.050 | 6.23 | 1.84 | 80 | 37 | 0.46 | Good | Good | Good |
| Example 2 | 0.050 | 3.53 | 1.84 | 80 | 32 | 0.40 | Good | Good | Good |
| Example 3 | 0.050 | 5.16 | 1.84 | 80 | 35 | 0.44 | Good | Good | Good |
| Example 4 | 0.012 | 6.99 | 1.04 | 80 | 32 | 0.40 | Good | Good | Good |
| Example 5 | 0.050 | 5.64 | 1.84 | 80 | 35 | 0.44 | Good | Good | Good |
| Example 6 | 0.050 | 5.64 | 1.84 | 80 | 35 | 0.44 | Good | Good | Good |
| Example 7 | 0.050 | 5.64 | 1.84 | 80 | 35 | 0.44 | Good | Good | Good |
| Example 8 | 0.050 | 5.64 | 1.84 | 80 | 35 | 0.44 | Good | Good | Good |
| Example 9 | 0.050 | 5.64 | 1.84 | 80 | 34 | 0.43 | Good | Excellent | Good |
| Example 10 | 0.050 | 5.64 | 1.84 | 80 | 34 | 0.43 | Good | Excellent | Good |
| Example 11 | 0.032 | 9.57 | 1.71 | 80 | 61 | 0.76 | Excellent | Good | Good |
| Example 12 | 0.050 | 5.52 | 1.84 | 80 | 58 | 0.73 | Excellent | Good | Good |
| Example 13 | 0.100 | 2.74 | 2.08 | 80 | 40 | 0.50 | Good | Good | Good |
| Example 14 | 0.175 | 2.07 | 3.33 | 80 | 38 | 0.48 | Good | Good | Good |
| Example 15 | 0.250 | 1.36 | 4.76 | 80 | 32 | 0.40 | Good | Good | Good |
| Example 16 | 0.050 | 5.37 | 2.30 | 107 | 89 | 0.83 | Excellent | Good | Good |
| Example 17 | 0.100 | 1.63 | 1.90 | 95 | 23 | 0.24 | Good | Good | Good |
| Example 18 | 0.050 | 2.65 | 2.30 | 114 | 30 | 0.26 | Good | Good | Good |
| Example 19 | 0.050 | 3.28 | 2.30 | 150 | 35 | 0.23 | Good | Good | Good |
| Example 20 | 0.050 | 4.83 | 1.84 | 80 | 32 | 0.40 | Good | Good | Good |
| Example 21 | 0.050 | 4.83 | 2.30 | 107 | 89 | 0.83 | Excellent | Good | Good |
| Example 22 | 0.050 | 5.64 | 1.84 | 80 | 35 | 0.44 | Good | Good | Good |
| Example 23 | 0.050 | 5.64 | 1.84 | 80 | 35 | 0.44 | Good | Good | Good |
| Example 24 | 0.050 | 5.64 | 1.84 | 80 | 35 | 0.44 | Good | Good | Good |
| Example 25 | 0.050 | 5.64 | 1.84 | 80 | 35 | 0.44 | Good | Good | Good |
| Example 26 | 0.050 | 5.64 | 1.84 | 80 | 35 | 0.44 | Good | Good | Good |
| Comparative Example 1 | 0.052 | 0.48 | 1.70 | 68 | 14 | 0.21 | Not good | Good | Good |
| Comparative Example 2 | 0.100 | 0.70 | 2.38 | 107 | 11 | 0.10 | Not good | Good | Good |
| Comparative Example 3 | 0.050 | 3.27 | 0.89 | 107 | 19 | 0.18 | Not good | Good | Good |
| Comparative Example 4 | 0.100 | 0.70 | 1.11 | 150 | 8 | 0.05 | Not good | Good | Good |
| Comparative Example 5 | 0.100 | 3.53 | 1.11 | 150 | 32 | 0.21 | Not good | Not good | Not good |

As apparent from Tables 1 and 2, in each Example, both $(f_3 \times t_3)/(f_2 \times t_2) => 1$ and $1 <= 33 f_1/(F \times T)$ were satisfied, and the formability was excellent. Also, in each Example, the electric contact properties and the corrosion resistance were excellent.

When Example 13 was compared with Example 17 each having the same structure of the copper foil laminate, the value of $(f_3 \times t_3)/(f_2 \times t_2)$ in Example 13 was greater than that in Example 17, because F and so on were measured by conducting the tensile test at room temperature (about 25° C.) in Example 13. It can be concluded that the resin layer in Example 17 was weak (i.e., $f_3$ is small) due to high test temperature.

On the other hand, in Comparative Example 1 where the resin film was laminated without conducting the surface treatment of the copper foil, the adhesion strength was decreased, $33 f_1/(F \times T)$ was less than 1, and the formability was poor.

In Comparative Examples 2 and 4 where the pressing pressure upon lamination was decreased to 100 N/cm², the adhesion strength was decreased, $33 f_1/(F \times T)$ was less than 1, and the formability was poor.

In Comparative Example 3 where the thickness of the resin film was decreased, the strength of the resin film was decreased as compared with the copper foil and $(f_3 \times t_3)/(f_2 \times t_2)$ was less than 1, and the formability was poor.

In Comparative Example 5 where the coating amount of the Cr oxide layer on the surface not adhered to the resin layer was less than 5 μg/dm², the corrosion resistance was decreased.

What is claimed is:

1. A copper foil composite comprising a copper foil and a resin layer laminated thereon, satisfying an equation 1: $(f_3 \times t_3)/(f_2 \times t_2) \geq 1$ wherein $t_2$ is a thickness of the copper foil measured in mm, $f_2$ is a stress of the copper foil measured in MPa under tensile strain of 4%, $t_3$ is a thickness of the resin layer measured in mm, $f_3$ is a stress of the resin layer measured in MPa under tensile strain of 4% measure and an equation 2: $1 \leq 33 f_1/(F \times T)$ wherein $f_1$ is 180° peeling strength between the copper foil and the resin layer measured in N/mm, F is strength of the copper foil composite measured in MPa under tensile strain of 30%, and T is a thickness of the copper foil composite measured in mm, wherein a Cr oxide layer is formed at a coating amount of 5 to 100 μg/dm² on a surface of the copper foil on which the resin layer is not laminated, and further wherein the 180° peeling strength is measured by conducting a 180° peel test as the surface of the copper foil in a composite test specimen is fixed on a SUS plate and the resin layer is peeled in a direction at an angle of 180° in accordance with JIS-05016.

2. The copper foil composite according to claim 1, wherein a Ni layer or a Ni alloy layer having a thickness of 0.001 to 5.0 μm is formed between the Cr oxide layer and the copper foil.

3. The copper foil composite according to claim 2, wherein the thickness of the Ni layer or the Ni alloy layer is 0.001 to 0.10 μm.

4. The copper foil composite according to claim 3, wherein the equations 1 and 2 are true at the temperature lower than the glass transition temperature of the resin layer.

5. The copper foil composite according to claim 3, wherein a ratio I/L of fracture strain I of the copper foil composite to fracture strain L of the resin layer alone is 0.7 to 1.

6. A formed product obtained by working the copper foil composite according to claim 3.

7. A method of producing a formed product comprising working the copper foil composite according to claim 3.

8. The copper foil composite according to claim 2, wherein the equations 1 and 2 are true at the temperature lower than the glass transition temperature of the resin layer.

9. The copper foil composite according to claim 2, wherein a ratio I/L of fracture strain I of the copper foil composite to fracture strain L of the resin layer alone is 0.7 to 1.

10. A formed product obtained by working the copper foil composite according to claim 2.

11. A method of producing a formed product comprising working the copper foil composite according to claim 2.

12. The copper foil composite according to claim 1, wherein the equations 1 and 2 are true at the temperature lower than the glass transition temperature of the resin layer.

13. The copper foil composite according to claim 12, wherein a ratio I/L of fracture strain I of the copper foil composite to fracture strain L of the resin layer alone is 0.7 to 1.

14. A formed product obtained by working the copper foil composite according to claim 12.

15. A method of producing a formed product comprising working the copper foil composite according to claim 12.

16. The copper foil composite according to claim 1, wherein a ratio I/L of fracture strain I of the copper foil composite to fracture strain L of the resin layer alone is 0.7 to 1.

17. A formed product obtained by working the copper foil composite according to claim 16.

18. A method of producing a formed product comprising working the copper foil composite according to claim 16.

19. A formed product obtained by working the copper foil composite according to claim 1.

20. A method of producing a formed product comprising working the copper foil composite according to claim 1.

* * * * *